United States Patent [19]

Meigs

[11] Patent Number: 4,670,692
[45] Date of Patent: Jun. 2, 1987

[54] HIGH-SPEED POWER AMPLIFIER FOR DRIVING INDUCTIVE LOADS

[75] Inventor: Gordon W. Meigs, Beaverton, Oreg.

[73] Assignee: Tektronix, Inc., Beaverton, Oreg.

[21] Appl. No.: 651,732

[22] Filed: Sep. 17, 1984

[51] Int. Cl.[4] .......................... H01J 29/70; H01J 29/76
[52] U.S. Cl. ...................................... 315/408; 315/399
[58] Field of Search ........................ 315/399, 408, 397; 331/20

[56] References Cited

U.S. PATENT DOCUMENTS

| | | | |
|---|---|---|---|
| 3,894,270 | 7/1975 | Manske | 315/379 |
| 3,930,122 | 12/1975 | Morita et al. | 331/20 |
| 4,028,589 | 6/1977 | Verbeij | 315/408 |
| 4,162,433 | 7/1979 | Van Hattum et al. | 315/408 |
| 4,216,414 | 8/1980 | Waehner | 315/388 |
| 4,281,275 | 7/1981 | Chapman et al. | 315/408 |
| 4,472,662 | 9/1984 | Freed | 315/408 |

OTHER PUBLICATIONS

J. Markus, Guidebook of Electronic Circuits, 1974, McGraw-Hill, Inc., p. 517, TK7867.M34, PWM for DC Motor Control Circuit.

*Primary Examiner*—Theodore M. Blum
*Attorney, Agent, or Firm*—John D. Winkelman; Paul S. Angello

[57] ABSTRACT

A high-speed power amplifier for driving inductive loads is capable of operating at frequencies of at least 270 kHz. The drive amplifier includes an oscillator that develops a continuous square-wave signal having relatively short transition times and a regulated 50% duty cycle. The oscillator output signal is applied to a filar-wound impedance transformer whose response time characteristics do not change substantially the transition time characteristics of the oscillator output signal. The impedance transformer circuit includes a pair of transistors operating in a push-pull configuration simultaneously to maintain the relatively short transition times of the oscillator output signal and to develop the high-current transformer output signal needed to drive a power transistor switch. The power amplifier is designed to provide a base current signal that promotes better dissipation of the power generated in the power transistor as it operates at high switching speeds. An exemplary embodiment of the power amplifier drives the yoke mechanism of the horizontal deflection circuitry of a display system employing a cathode ray tube. Operating the power amplifier at higher frequencies increases the degree of resolution of an image formed by such a display system.

8 Claims, 8 Drawing Figures

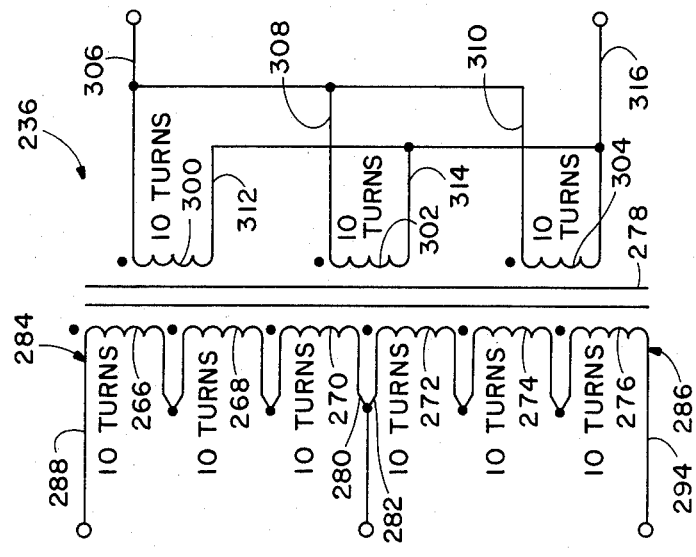
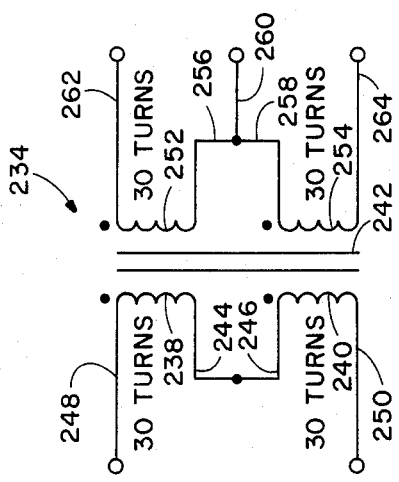
FIG. 4B
FIG. 4A

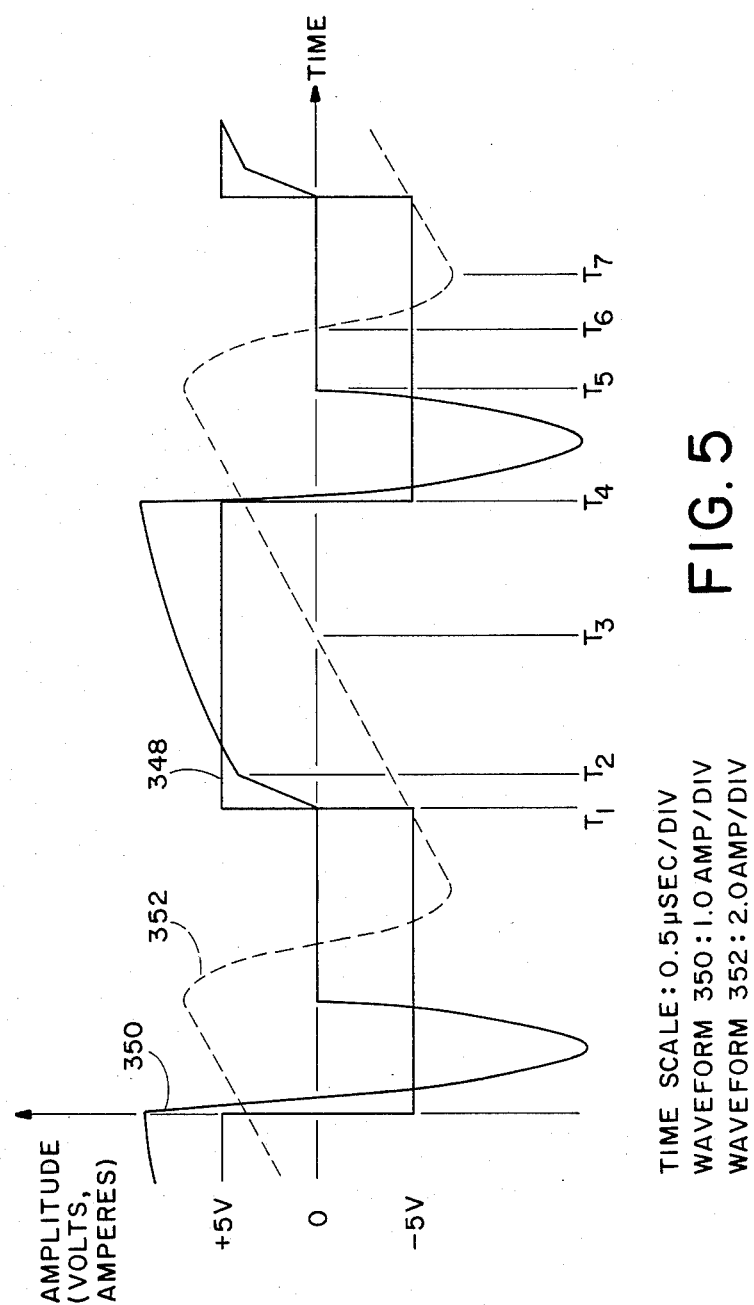

HIGH-SPEED POWER AMPLIFIER FOR DRIVING INDUCTIVE LOADS

BACKGROUND OF THE INVENTION

The present invention relates to power amplifier circuits and, in particular, to a power amplifier that is capable of delivering to inductive loads large amounts of current at relatively high repetition rates.

A power amplifier that is designed to drive inductive loads typically operates as a high-current switching device. Power amplifiers of this type are used, for example, to drive the yoke mechanism of the horizontal deflection circuitry of a display system employing a cathode ray tube. The switching rate or operating frequency of the power amplifier is one factor that determines the degree of resolution of an image formed by such a display system. A state of the art power amplifier of this type is generally recognized as one whose maximum operating frequency is approximately 64 kHz.

There are several reasons why the maximum operating frequency of such power amplifiers is limited. One reason is the presence of leakage inductance in impedance transformer circuitry that is employed to develop a sufficient amount of current to drive the switching device to which the inductive load is applied. The reactance of the leakage inductance increases as the operating frequency increases and effectively inhibits the production of a drive signal for the switching device. A second reason is that the drive signals produced in conventional drive circuits have current waveforms that do not promote an efficient use of the power required to drive the switching device. Such inefficient use of power creates dissipation problem that make the switching device susceptible to destruction at high switching speeds. A third reason is that the resistance in the inductive load itself causes excessive power dissipation to occur whenever current is delivered through it at high switching rates.

One of the objects of this invention is, therefore, to provide a power amplifier for driving an inductive load with a large amount of current at frequencies in excess of 270 kHz.

Another object of this invention is to provide in such a power amplifier protection for the output signal switching device from destruction resulting from the loss of an input signal or improper power supply voltages.

Another object of this invention is to provide in such a power amplifier filar-wound impedance transformer circuitry that reduces the leakage inductance and thereby extends the operating frequency of the amplifier.

A further object of this invention is to provide in such a power amplifier a transistor switching device that is driven by current waveforms that promote the efficient use of the power generated to operate the device.

Still another object of this invention is to provide in such a power amplifier an impedance transformer circuit that employs a push-pull amplifier subcircuit to produce a high-current waveform with relatively fast transition times.

Yet another object of this invention is to provide such a power amplifier to improve the degree of resolution of an image formed by a display system employing a cathode ray tube.

SUMMARY OF THE INVENTION

The present invention relates to a high-speed power amplifier for driving inductive loads. The power amplifier comprises an oscillator for developing a continuous square-wave signal at its output. A switching circuit includes a power transistor that provides in response to the oscillator output signal a high-current switching signal to an inductive load which is applied to its output. An impedance transformer or matching circuit is disposed between the oscillator and the switching circuit to match the output impedance of the oscillator to the input impedance of the switching circuit. The impedance matching circuit comprises a filar-wound power transformer whose response time characteristics do not change substantially the transition time characteristics of the continuous-wave signal developed at the oscillator output. The power amplifier of the present invention is capable of operating at frequencies of at least 270 kHz. This is accomplished primarily by providing an amplifier circuit whose overall design is optimized for maintaining the transition time characteristics of the square-wave signal developed at the oscillator output.

A power amplifier designed for the horizontal deflection circuitry of a display system employing a cathode ray tube is described herein by way of example. The power amplifier utilizes a filar-wound impedance transformer circuit that develops at its output a high-current replica of the oscillator square-wave output signal. The impedance transformer output signal is delivered to a coupling circuit located at the base terminal of the power transistor switch. The impedance transformer circuit employs a pair of transistors that are arranged in a push-pull configuration simultaneously to maintain the relatively short transition times of the oscillator output signal and to develop the high-current transformer output signal.

The coupling circuit positioned at the input of the drive signal circuit ensures that the drive current delivered to the base terminal of the power transistor increases during the time the yoke current flowing through the transistor increases. A base current waveform of this character promotes the dissipation of the power generated in the power transistor as it operates at high switching speeds. The current delivered to the base terminal of the power transistor is also preserved by a diode connected to its collector terminal through which the yoke current flows while the power transistor is biased in its conducting state. The diode prevents the flow of current through the collector of the power transistor during the portion of the sweep period when the yoke current is flowing into the yoke and the drive current is flowing into the base of the power transistor. Preventing the flow of yoke current from the collector during this time allows the base current to bias the power transistor into saturation in preparation for sinking the yoke current when it flows through the device at the intended time.

The oscillator is equipped with a pulse-shaping integrator circuit to ensure that the oscillator square-wave output signal always has a 50% duty cycle. A 50% duty cycle is desirable because it eliminates the presence of a DC component in the signal applied to the impedance transformer circuit, which is susceptible to decreases in efficiency resulting from the presence of DC drive signals. The oscillator is also equipped to generate internally a signal at a predetermined frequency to ensure that a continuous-wave signal is always present at its output.

The drive amplifier also employs a power level protection circuit that rapidly responds to cease operation of the amplifier whenever there is detected a drop in certain ones of the supply voltages. The protection circuit prevents the destruction of the power transistor upon a power supply regulator failure.

Additional objects and advantages of the present invention will be apparent from the following detailed description of a preferred embodiment thereof, which proceeds with reference to the accompanying drawings.

BRIEF DESCRIPTION OF THE DRAWINGS

FIGS. 4A and 4B are schematic diagrams for the input transformer and output transformer, respectively, of the impedance transformer circuit of FIG. 2.

FIG. 5 is a diagram of signal waveforms developed by the drive amplifier of the present invention.

DETAILED DESCRIPTION OF PREFERRED EMBODIMENT

A preferred embodiment of the power amplifier of the present invention is described by way of example as part of a horizontal deflection circuit for a display system employing a cathode ray tube.

Oscillator

Figure 1:
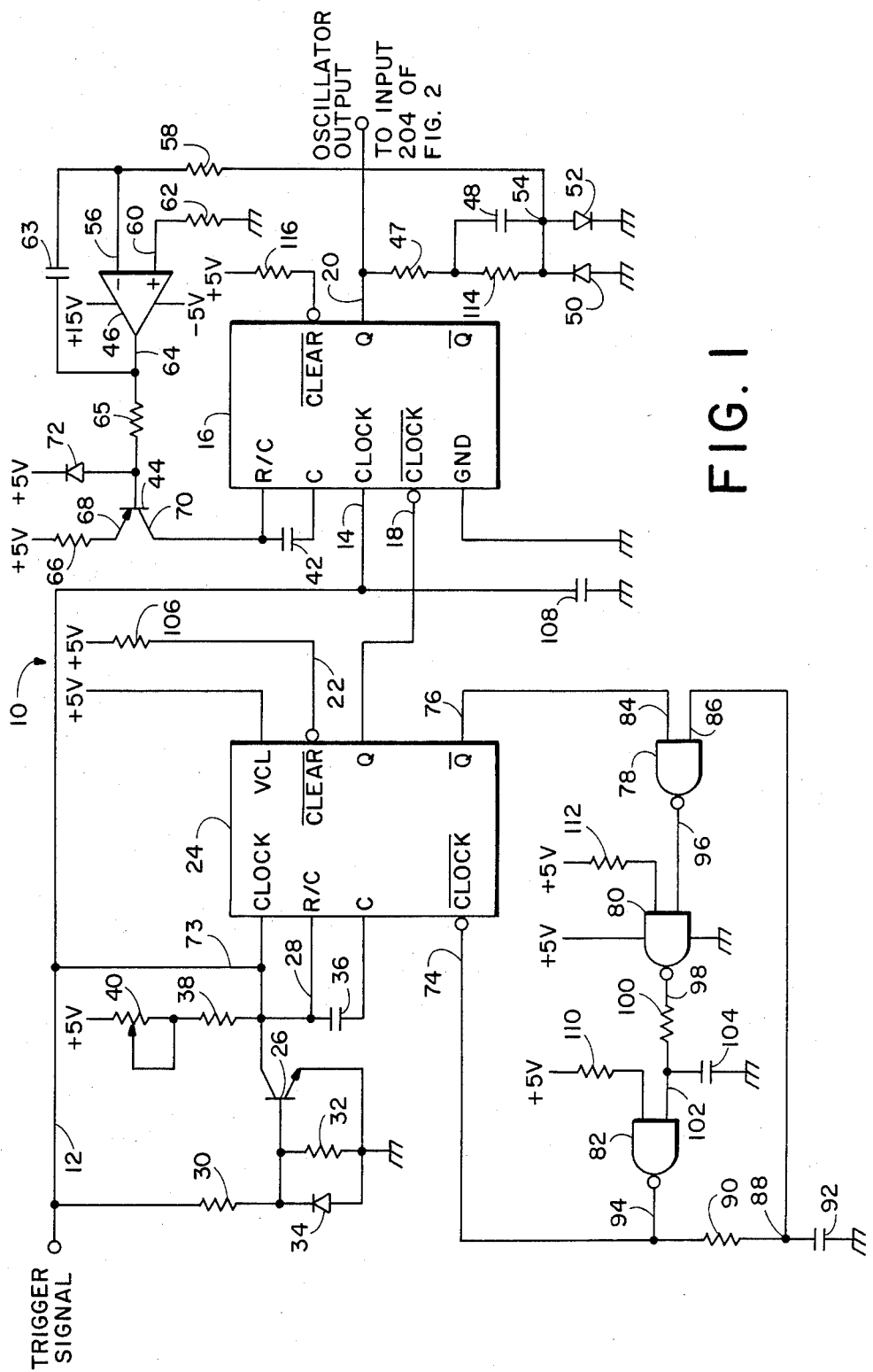
FIG. 1 is an electrical circuit diagram of an oscillator circuit that develops a 50% duty cycle continuous square-wave signal in accordance with the present invention.

FIG. 1 is a schematic diagram of an oscillator circuit 10 that provides a 125 kHz continuous square-wave output signal of a 50% duty cycle at TTL logic voltage levels. This signal is utilized for developing the drive signal that operates the power transistor switch to which the yoke of a cathode ray tube horizontal deflection circuit is applied. Oscillator 10 develops a continuous square-wave output signal either in synchronism with or independently of an externally applied horizontal sweep synchronizing or trigger signal.

Horizontal Trigger Signal Present

Figure 2:
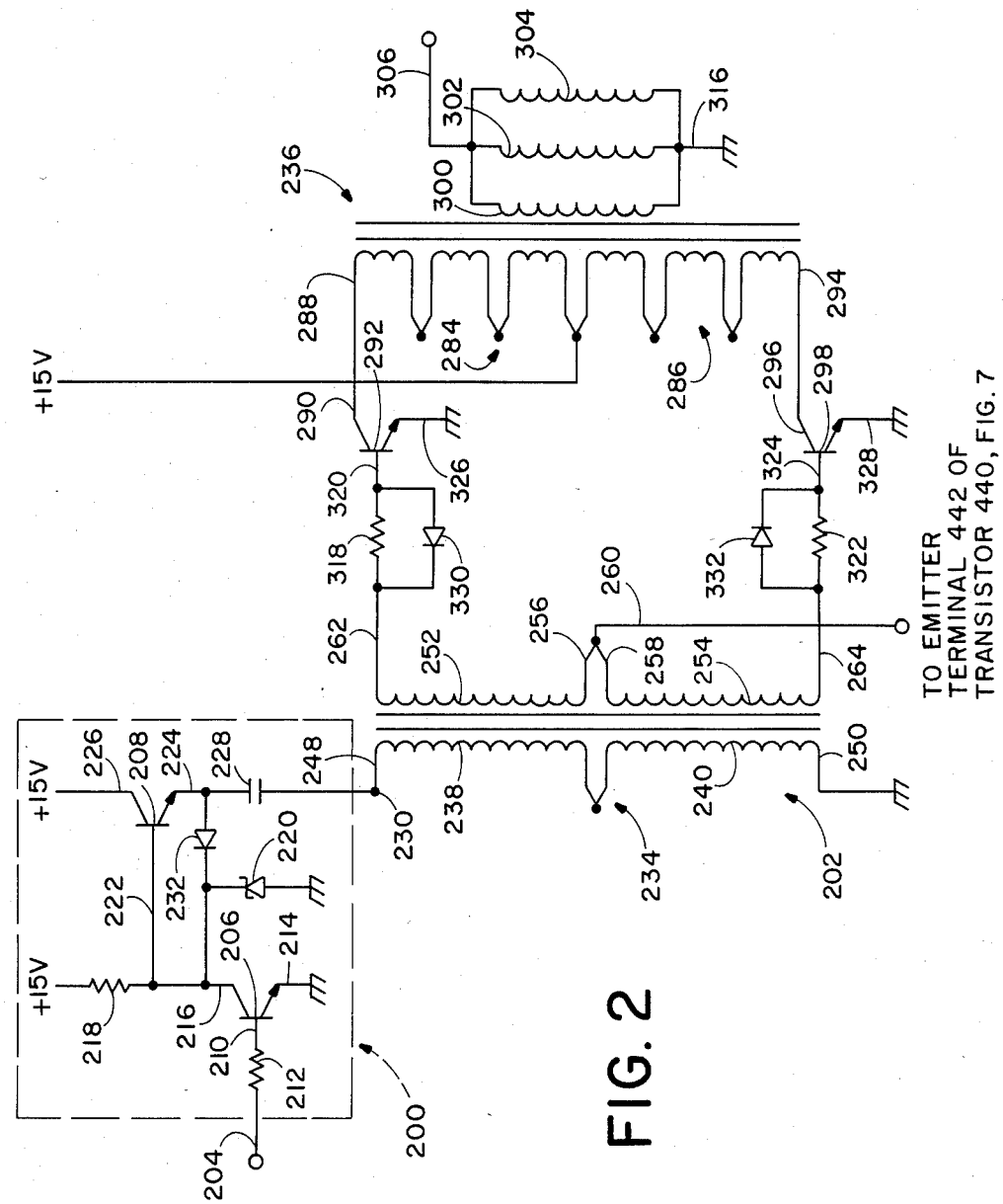
FIG. 2 is a electrical circuit diagram of the oscillator output buffer circuit and the filar-wound high-current impedance transformer circuit.

With reference to FIG. 1, the horizontal trigger signal is applied to input terminal 12 of oscillator 10. The trigger signal is a low duty cycle pulse train of TTL logic voltage levels, i.e., in any cycle the signal is in the logic 1 state no greater than 30% of the time. A transition from the logic 0 state to the logic 1 state initiates a horizontal sweep. The horizontal trigger signal is applied directly to clock input 14 of monostable multivibrator 16, which is a 96LS02 or equivalent device. Whenever the horizontal trigger signal changes from the logic 0 state to the logic 1 state and the inverting clock input 18 of monostable 16 is held in the logic 1 state, a logic 1 state appears at Q output 20 for a period determined by timing circuitry that is described below. The successive transitions from the logic 0 state to the logic 1 state of the horizontal trigger signal applied to input 14 of monostable 16 produces at Q output 20 a continuous stream of pulses at TTL logic voltage levels that are applied to input terminal 204 of buffer circuit 200 (FIG. 2).

The inverting clock input 18 of monostable 16 must be held in the logic 1 state because of internal connections within monostable 16. If input 18 were held in the logic 0 state, monostable 16 would trigger and remain in the logic 1 state. To avoid this problem, inverting clock input 18 is held in the logic 1 state by connecting it to output 22 of monostable multivibrator 24, which is locked in a logic 1 state when triggering signals are present at input 12. This locking circuitry consists of NPN transistor 26 and related components, which serve to hold input 28 of monostable 24 near ground when triggering signals are present at input 12. Transistor 26 is a MPS6521 or equivalent device.

Whenever input 28 of monostable 24 is held near ground, its Q output 22 assumes a logic 1 state, which enables monostable 16 to be clocked in its normal fashion by the horizontal trigger signal at input 14. Resistors 30 and 32 of 10 kilohms and diode 34 serve to bias transistor 26 into saturation whenever horizontal trigger pulses are applied to terminal 12. Diode 34 is a 1N4152 or equivalent device. The storage charge accumulated in transistor 26 while it is in saturation keeps input 28 of monostable 24 near ground for a short time after the horizontal triggering signal has returned to the logic 0 state. This storage charge, in conjunction with the timing components comprising capacitor 36 of 0.001 uf, resistor 38 of 18 kilohms, and variable resistor 40 of 5 kilohms, would normally cause monostable 24 to turn on for a period corresponding to a 30 kHz rate. Since the horizontal triggering signal recurs at a rate of 125 kHz the monostable 24 never times out and input 28 is held near ground as long as the horizontal trigger signal is present at input 12. This causes a logic 1 state to appear at output 22 of monostable 24 and input 18 of monostable 16.

Whenever the frequency of the horizontal trigger signal drops below 30 kHz, the storage charge of transistor 26 is no longer able to maintain input 28 of monostable 24 at ground potential for the duration of the horizontal trigger cycle. Under these circumstances, each pulse of the horizontal trigger signal triggers monostable 24 to produce output pulses at the 30 kHz rate set by the timing resistors 38 and 40, capacitor 36, and the storage capacitance of transistor 26.

Since inverting clock input 18 of monostable 16 is held in the logic 1 state in the presence of triggering signals, monostable 16 is enabled to produce an output pulse each time it is triggered at input 14. The duration of this output pulse is determined by the charging rate of capacitor 42 of 0.001 uf by transistor 44, which is a MPS6523 or equivalent device and operates as a variable current source. As will be hereinafter described, this duration is automatically regulated by operational amplifier 46, which is a LF356 or equivalent device, and transistor 44 to be one half of the period of the horizontal triggering signal. Since monostable 16 is triggered by each transition from the logic 0 state to the logic 1 state at its input 14, the duty cycle of the pulse train produced at output 20 will be regulated at 50%. A continuous square-wave signal having a 50% duty cycle, therefore, appears at output 20 of monostable 16.

The stream of pulses that appear at output 20 of monostable 16 in response to the repeated triggering at its input 14 by the horizontal trigger pulses passes through resistor 47 of 8.2 kilohms and is AC coupled through capacitor 48 of 0.1 uf into diodes 50 and 52. Diodes 50 and 52 are 1N4152 or equivalent devices. Capacitor 48 converts the TTL pulse train to a bipolar signal centered about zero volts at node 54. Diode 50 is connected with its cathode to node 54 and its anode to ground to limit the negative voltage pulses to −0.6 volt. Diode 52 is connected with its anode to node 54 and its cathode to ground to limit the positive voltage pulses to +0.6 volt.

If the duty cycle of output 20 of monostable 16 is exactly 50%, the time that the bipolar signal at node 54 is above ground will be equal to the time that it is below ground. This will produce a time averaged net voltage of zero at inverting input 56 of operational amplifier 46, which input 56 is connected through resistor 58 of 16 kilohms to node 54. Noninverting input 60 of operational amplifier 46 is connected to ground through resistor 62 of 16 kilohms. Capacitor 63 of 0.1 uf and operational amplifier 46 operate as an integrator that takes the difference between the voltage level present at its input 56 and the essentially zero volt reference at its input 60 and presents an amplified difference signal at its output 64. If the signal at node 54 is +0.6 volts for a time equal to the time it is −0.6 volts, the signal at output 64 will be bounded in the region of −3 volts to +4.5 volts. The voltage appearing at output 64 of amplifier 46 is applied through resistor 65 of 5.1 kilohm to base terminal 67 of transistor 44. This voltage causes current to flow through resistor 66 of 560 ohms from emitter terminal 68 to collector terminal 70 of transistor 44 and constitutes the appropriate amount of charging current that need be delivered to capacitor 42 to maintain the duty cycle of the signal at output 20 of monostable 16 at 50%. Diode 72, which is a 1N4152 or equivalent device, is connected between the base of transistor 44 and the +5 volt DC supply to limit the base drive to prevent transistor 44 from zenering in the presence of relatively high base voltages. The current flowing from transistor 44 into capacitor 42 is regulated to maintain the duty cycle of the pulse train at 50%, regardless of the appropriate duty cycle or frequency of the trigger signal.

Whenever the duty cycle of the signal appearing at output 20 of monostable 16 is greater than 50% (i.e., the signal in a given cycle is in the logic 1 state for a longer time than it is in the logic 0 state), the voltages appearing at node 54 would be +0.6 volts more often than −0.6 volts. Since these voltages are delivered to inverting input 56 of operational amplifier 46, the voltage at output 64 would progressively drop below its quiescent value, thereby to increase the amount of current flowing through collector 70 of transistor 44 and into capacitor 42. Increasing the amount of current flowing into capacitor 42 has the effect of shortening the length of time a pulse appearing at Q output 20 of monostable 16 is in the logic 1 state, thereby returning the duty cycle to 50%.

Whenever the duty cycle of the signal appearing at output 20 of monostable 16 is less than 50% (i.e., the signal in a given cycle is in the logic 0 state for a time longer than it is in the logic 1 state), the voltages appearing at node 54 would be −0.6 volts more often than +0.6 volts. Under these conditions, the voltage at output 64 of operational amplifier 46 would progressively increase above its quiescent value, thereby to decrease the amount of current flowing through collector terminal 70 of transistor 44 and into capacitor 42. Decreasing the amount of current flowing into capacitor 42 has the effect of increasing the length of time a pulse appearing at output 20 of monostable 16 in the logic 1 state, thereby returning the duty cycle to 50%.

Operational amplifier 46 and variable current source transistor 44 cooperate to maintain a time-averaged signal of zero volts at node 54, thereby to maintain the duty cycle of the continuous square-wave signal at output 20 of monostable 16 at 50%. This is accomplished regardless of the appropriate duty cycle or frequency of the horizontal trigger signal.

Horizontal Trigger Signal Absent

Figure 3:
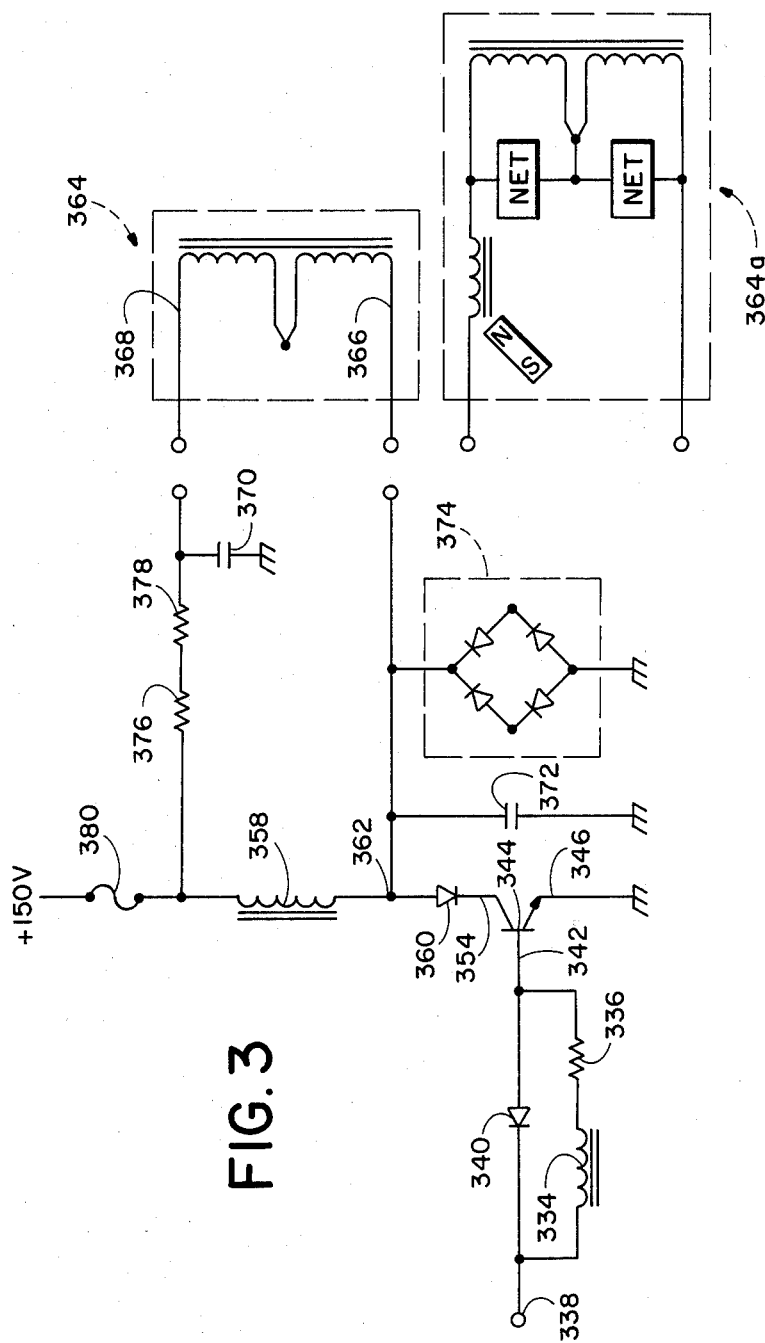
FIG. 3 is an electrical circuit diagram of the coupling and drive signal circuits.

The absence of a horizontal trigger signal at input terminal 12, in conjunction with monostable 16 remaining in a static logic 1 state, causes a large amount of continuous current flow through switching transistor 344 (FIG. 3). The current flowing under these conditions will either destroy switching transistor 344 or cause fuse 380 to blow. To prevent such an occurrence, oscillator 10 is designed to produce a 125 kHz square-wave at output 20 of monostable 16 whenever the horizontal trigger signal is not applied to input terminal 12.

Whenever the horizontal trigger signal is not applied to terminal 12, transistor 26 is biased in the cutoff state and thereby is effectively disconnected from monostable 24. Under these conditions, monostable 24 operates as a one-shot oscillator whose output pulse length is established by the values of capacitor 36 and resistors 38 and 40. The above-indicated values of these components produces a 125 kHz pulse train at output 20 of monostable 16. Since its clock input 73 is in the logic 0 state in the absence of a horizontal trigger signal at input terminal 12, monostable 24 is triggered by applying a signal to its inverting clock input 74. The signal applied to input 74 is developed by feeding back the $\overline{Q}$ output 76 of monostable 24 through cascaded NAND gates 78, 80 and 82 to input 74 of monostable 24. NAND gates 78, 80 and 82 are biased so that whenever monostable 24 times out and its $\overline{Q}$ output 76 changes to the logic 1 state, the output of NAND gate 82 switches to the logic 0 state, thereby providing a trigger signal at the inverting clock input 74 of monostable 24.

In particular, whenever monostable 24 times out and its $\overline{Q}$ output 76 returns to the logic 1 state, a logic 1 state appears at input 84 of NAND gate 78. Input 86 of NAND gate 78 is connected to junction node 88 of resistor 90 of 510 ohms and capacitor 92 of 270 pf, whose other lead is connected to ground. The other lead of resistor 90 is connected to output 94 of NAND gate 82 and inverting input 74 of monostable 24. Under these conditions, the input 86 of NAND gate 78 is required to have been in the logic 1 state to have allowed monostable 24 to time out. Both inputs 84 and 86 of NAND gate 78 are in the logic 1 state which produces a logic 0 state at output 96 of NAND gate 78 and a logic 1 state at output 98 of NAND gate 80, which is configured as a logic inverter. Output 98 of NAND gate 80 is connected to one lead of resistor 100 of 510 ohms. The other lead of resistor 100 is connected to input 102 of NAND gate 82 and one lead of capacitor 104 of 270 pf, whose other lead is connected to ground. The logic 1 state appearing at output 98 of NAND gate 80 and input 102 of NAND gate 82 produces a logic 0 state at output 94 of NAND gate 82 which produces a trigger signal to inverting input 74 of monostable 24. The above-described cycle repeats itself each time monostable 24 times out and its $\overline{Q}$ output 76 returns to a logic 1 state.

Whenever a horizontal trigger signal is not applied to input terminal 12, monostable 24 automatically retriggers to produce a continuous pulse train at its Q output 22 and $\overline{Q}$ output 76. Resistors 38 and 40 and capacitor 36 establish an 8 usec pulse period, which corresponds to a frequency of 125 kHz. The 125 kHz signal appearing at Q output 22 of monostable 24 has a duty cycle of almost 100%. This signal is applied to inverting clock input 18 of monostable 16. The signal appearing at input 18 of monostable 16 undergoes a brief transition to the logic 0 state once every 8 usec. The transition from the logic 1 state to the logic 0 state causes a pulse to appear at Q output 20 of monostable 16. Operational amplifier 46 and transistor 44 cooperate to provide a 50% duty cycle continuous square-wave signal at Q output 20 of monostable 16 in the above-described manner. Oscillator circuit 10 provides a continuous square-wave signal with a 50% duty cycle irrespective of whether the horizontal trigger signal is applied to the circuit. The output signal of oscillator 10 will automatically be locked to the frequency of the trigger signal, if one is present, or will operate at a predetermined frequency if the trigger signal is absent. In addition, the phase noise of oscillator 10 operating in the triggered mode is minimized by creating the continuous wave output signal by means of a single, low noise active timing device, i.e., monostable 16.

Input Buffer Circuit

With reference to FIG. 2, impedance buffer circuit 200 provides an interface between the output of oscillator 10 and the input of switch drive impedance transformer circuit 202. Buffer circuit 200 receives the oscillator output signal from Q output 20 of monostable 16 (FIG. 1) and conditions it to drive the low input impedance presented by impedance transformer circuit 202.

The square-wave output signal of oscillator 10 is applied to input terminal 204 of the input buffer circuit 200, which is an electronic switching circuit comprised of NPN transistors 206 and 208. Transistors 206 and 208 are 2N3904 or equivalent devices. The signal is delivered to base terminal 210 of transistor 206 through resistor 212 of 470 ohms. Transistor 206 is biased as a switch, its emitter terminal 214 being connected direct to ground and its collector terminal 216 being connected to a +15 volt DC supply through resistor 218 of 270 ohms and 0.5 watt rating. An inverted, amplified replica of the 125 kHz oscillator output signal appears at collector terminal 216 of transistor 206. A 12 volt zener diode 220 is connected between ground and collector terminal 216 of transistor 206 to establish a +12 volt maximum collector voltage. It has been observed that the rise time of the signal appearing at base terminal 210 is maintained at collector terminal 216 of transistor 206 by limiting the collector voltage to +12 volts. The fast transition times of the square-wave signal developed at the output of oscillator 10, therefore, are preserved.

Collector terminal 216 of transistor 206 is connected direct to base terminal 222 of transistor 208, which is biased as a noninverting switch whose emitter terminal 224 serves as its output. Collector terminal 226 of transistor 208 is connected direct to the +15 volt DC supply. Emitter terminal 224 of transistor 208 is connected through capacitor 228 of 2 uf to input terminal 230 of impedance transformer circuit 202. Capacitor 228 AC couples the 10.8 volt peak-to-peak square-wave signal appearing at emitter terminal 224 to provide a bipolar signal of the same frequency to input terminal 230. The value of capacitor 228 is selected effectively to compensate for the load impedance presented by the input impedance transformer circuit 202.

A diode 232, which is a 1N4152 or equivalent device, is employed to decrease the switching time between the high and low voltage states of the square-wave signal at emitter terminal 224 of transistor 208. Diode 232 is installed with its anode connected to emitter terminal 224 of transistor 208 and its cathode connected to collector terminal 216 of transistor 206. Whenever the signal applied to base terminal 210 of transistor 206 drives transistor 206 to the conducting state, diode 232 provides a path to ground through the saturated collector-emitter of transistor 206 to remove the charge that accumulated on capacitor 228 during the immediately preceding high voltage state of emitter terminal 224 of transistor 208. A 125 kHz bipolar square-wave signal having a peak-to-peak amplitude of 10.8 volts, therefore, appears at input terminal 230 of impedance transformer circuit 202.

Impedance Transformer Circuit

With reference to FIG. 2, impedance transformer circuit 202 provides a high power, high current 125 kHz square-wave output signal for driving the input of switch drive circuit of FIG. 3. Impedance transformer circuit 202 accomplishes this task while maintaining the fast transition times of the square-wave signal presented at its input terminal 230.

Impedance transformer circuit 202 comprises an input transformer 234 and an output transformer 236. Transformers 234 and 236 are filar-wound power transformers, whose response time characteristics do not change substantially the transition time characteristics of the square-wave signals applied to them. A filar-wound transformer is defined herein as one whose primary and secondary windings are very close together and are wound on a common core. The objective is to approximate the ideal situation in which the space occupied by the primary and secondary windings is the same. Increasing the proximity of the primary and secondary transformer windings has the effect of increasing the mutual inductive coupling between them, thereby reducing the inductive losses in each one of them.

FIG. 4A is a schematic diagram of input transformer 234. Transformer 234 includes primary coils 238 and 240, each coil comprising thirty turns of 32 gauge enamel-coated wire that is wrapped in filar manner around the surface of an annular core 242. Annular core 242 is part number 276-0535, manufactured by and commercially available from Tektronix, Inc., or an equivalent device. The leads 244 and 246 of primary coils 238 and 240, respectively, are joined to form a series connection of the two coils. Lead 248 of primary coil 238 is connected to input terminal 230, and lead 250 of primary coil 240 is connected to ground (FIG. 2).

Transformer 234 also includes secondary coils 252 and 254, each coil comprising thirty turns of 32 gauge enamel-coated wire that is wrapped in filar manner around the surface of core 242. The leads 256 and 258 of coils 252 and 254, respectively, are connected to a common reference point 260, which is emitter terminal 442 of transistor 440 (FIG. 7) and is at ground potential during nominal operation of the power amplifier circuit.

Leads 262 and 264 of secondary coils 252 and 254, respectively, provide signals for a push-pull switching amplifier subcircuit that drives output transformer 236 as will be described below.

The above-described arrangement for impedance transformer 234 provides a 2 to 1 primary to secondary turns ratio for each one of the secondary coils 252 and 254. There is a 1 to 1 primary to secondary turns ratio with respect to the composite secondary winding. Thus, whenever the 10.8 volt peak-to-peak square-wave signal appears across terminals 248 and 250 of transformer 234, 5.4 volt peak-to-peak square-wave signals appear across leads 262 and 256 of secondary coil 252 and leads 258 and 264 of secondary coil 254. The signals across secondary coils 252 and 254 are 180° out-of-phase as viewed from leads 262 and 264 relative to reference point 260. In addition, there is a corresponding twofold increase in the magnitude of the current flowing through either secondary coil 252 or 254 as compared with that flowing through the series connected primary coils 238 and 240.

With reference to FIG. 4B, output transformer 236 includes six primary coils 266, 268, 270, 272, 274, and 276, each coil comprising ten turns of 26 gauge enamel-coated wire that is wrapped in filar manner around the surface of annular core 278. Annular core 278 is part number 57-1714 manufactured by Stackpole Carbon Co. or an equivalent device. As shown, the leads of the primary coils are connected in series in a manner analogous to that described for primary coils 238 and 240 of input transformer 234. The +15 volt DC supply is applied to lead 280 of primary coil 270 and lead 282 of primary coil 272 (FIG. 2). The composite primary coil of output transformer 236 is, therefore, comprised of two portions, a first primary portion 284 including primary coils 266, 268, and 270, and a second primary portion 286 including primary coils 272, 274, and 276. Lead 288 of first portion 284 is connected to collector terminal 290 of transistor 292, and lead 294 of second portion 286 is connected to collector terminal 296 of transistor 298 (FIG. 2). The first and second primary portions 284 and 286 constitute the loads that deliver a +15 volt bias voltage to the collectors of transistors 292 and 298, respectively.

Output transformer 236 also includes secondary coils 300, 302, and 304, each comprising ten turns of 26 gauge enamel-coated wire that is wrapped in filar manner around the surface of core 278. Leads 306, 308, and 310 of secondary coils 300, 302, and 304, respectively, are connected together. Leads 312, 314, and 316 of secondary coils 300, 302, and 304, respectively, are connected together. These connections form a parallel circuit of secondary coils 300, 302, and 304 which develop a signal across leads 306 and 316 that are applied to input terminal 338 of the switch drive circuit of FIG. 3 and ground, respectively.

The effective primary to secondary turns ratio is 3 to 1 for each of the primary portions loading the collector terminals of transistors 292 and 298. There is, therefore, a threefold increase in current that is induced through leads 306 and 316 as compared with that flowing through leads 294 and 288. The current flowing through leads 306 and 316 is delivered to the switch drive coupling circuit. In addition, there is a corresponding threefold diminution in the magnitude of the voltage applied to the input of the switch drive circuit as compared with that developed across either the first or second primary portion.

With reference to FIG. 2, the 125 kHz bipolar square-wave signal is applied to leads 248 and 250 of input transformer 234. Lead 250 of primary winding 240 is connected to ground. The voltage induced across leads 262 and 256 of secondary coil 252 causes current to flow through resistor 318 to base terminal 320 of NPN transistor 292. Similarly, the voltage induced across leads 264 and 258 of secondary coil 254 causes current to flow through resistor 322 to base terminal 324 of NPN transistor 298. Since the voltages induced across secondary coils 252 and 254 are 180° out-of-phase, the current flows to the base terminals of transistors 292 and 298 in alternate half cycles of the 125 kHz square-wave input signal. Resistors 318 and 322 have 27 ohms resistance at a 0.5 watt rating, and transistors 292 and 298 are MJE521 or equivalent devices. Collector terminal 290 of transistor 292 is connected to the +15 volt DC supply through first primary portion 284, and collector terminal 296 of transistor 298 is connected to the +15 volt DC supply through second primary portion 286. Emitter terminals 326 and 328 of transistors 292 and 298, respectively, are connected direct to ground.

Transistors 292 and 298 form a push-pull switching amplifier subcircuit. Whenever the signal appearing at input terminal 230 is greater than zero volts, a positive voltage develops on base terminal 320 of transistor 292 and causes current to flow through the primary coils of first primary portion 284 in the direction from collector terminal 290 to emitter terminal 326 of transistor 292. Transistor 298 is in the nonconducting state during this time. Whenever the signal appearing at input terminal 230 is less than zero volts, a positive voltage develops on base terminal 324 of transistor 298 and causes current to flow through the primary coils of second primary portion 286 in the direction from collector terminal 296 to emitter terminal 328 of transistor 298. Transistor 292 is in the nonconducting state during this time.

Diodes 330 and 332 are connected in parallel across resistors 318 and 322, respectively, to provide a low impedance path to ground for the charge accumulated in the bases of the transistors during the positive voltage half-cycle. Diodes 330 and 332 decrease the turn-off time of transistors 292 and 298, respectively. Diodes 330 and 332 are 1N4152 or equivalent devices.

The filar-wound output transformer 236, therefore, delivers to input 338 of the switch driver circuit a high power continuous square-wave signal of 5 volts maximum and 6 amperes maximum with relatively fast transition times. For a 125 kHz square-wave, the transition times have been measured to be about 0.1 usec.

Switch Drive Circuit

FIG. 3 is a diagram of the switch drive circuit that includes a coupling circuit and a power transistor which operates as a high-current switch. The coupling circuit receives the 125 kHz square-wave signal appearing at output transformer 236 and delivers a drive signal to the base terminal of the power transistor, which causes at the appropriate time a current signal to flow through the yoke of the horizontal deflection circuit of a cathode ray tube.

With reference to FIG. 3, the coupling circuit comprises an inductor 334 of 2.5 uH connected in series with resistor 336 of 0.5 ohms and 5 watt rating. Lead 338 of inductor 334 is the input terminal of the coupling circuit and is connected to lead 306 of output transformer 236. Diode 340, which is a 80SQ040 or equivalent device, is connected in parallel across inductor 334 and resistor 336, the cathode of diode 340 being connected to lead 338 of inductor 334. Inductor 334 is formed by wrapping six turns of 22 gauge enamel-coated wire around an annular core, such as an A-301072-2 core manufactured by Arnold Engineering. Resistor 336 is connected to base terminal 342 of NPN power transistor 344, which is part number 2SD348 manufactured by Sanyo or an equivalent device. Transistor 344 is employed as a high-current switch with its emitter terminal 346 connected direct to ground.

FIG. 5 is a diagram of the waveforms of the signals associated with the switch drive circuit. With reference to FIG. 5, waveform 348 represents the square-wave voltage signal on lead 338 of inductor 334. Waveform 350 represents the current flowing through base terminal 342 of transistor 344. Waveform 352 represents the current flowing through the yoke of the cathode ray tube deflection circuit.

As shown in FIG. 5, the square-wave signal on lead 338 undergoes at $T_1$ a transition from the end of a negative voltage cycle to the beginning of a positive voltage cycle. The current flowing into base terminal 342 of transistor 344 rapidly increases from zero to approximately 2.0 amperes during the time from $T_1$ to $T_2$ of approximately 0.4 usec. The rapid increase in current is caused by the residual energy stored in the inductor 334 left over from the immediately preceding positive voltage cycle. From $T_2$ to $T_4$ of approximately 3.6 usec, the current flowing into the base terminal 342 of transistor 344 steadily increases from 2.0 to approximately 4.4 amperes during the positive voltage cycle of the signal on lead 338; therefore, the amount of current delivered to base terminal 342 of transistor 344 generally increases during that time.

The current flowing into the base of transistor 344 causes current to flow through the yoke of the cathode ray tube in the direction from collector terminal 354 to the emitter terminal 346 of transistor 344. The amount of current flowing through the collector of transistor 344 increases from $T_3$ to $T_5$ as will be described later. The gradual increase in base current as time elapses through the positive cycle during the time the collector current of transistor 344 gradually increases provides better power management in that it eliminates the unnecessary preheating of the emitter-base junction of transistor 344 during the initial part of the positive voltage cycle.

Whenever the voltage on lead 338 is positive, diode 340 is reversed biased and no current flows through it. During the transition from a positive voltage cycle to a negative voltage cycle of the signal on lead 338, diode 340 is forward biased and provides a direct discharge path for the unwanted charge accumulated in the base of transistor 344 during the positive voltage cycle. This allows transistor 344 to turn off very quickly.

Collector terminal 354 of transistor 344 is connected to a +150 volt DC supply through choke 358 of 10 mh and diode 360 which are connected in series. Choke 358 is formed by wrapping 195 turns of 29 gauge-enamel coated wire on an annular core, such as an A-214276-2 device manufactured by Arnold Engineering. Diode 360 is a 1N3890 or equivalent device. The cathode of diode 360 is connected to collector terminal 354 of transistor 344. The inductive load of the power amplifier is connected to collector terminal 354 of transistor 344 at junction node 362 between choke 358 and diode 360. The inductive load in the exemplary preferred embodiment is a yoke 364 of the deflection circuit of a cathode ray tube. Lead 366 of yoke 364 is connected to junction node 362, and lead 368 is connected to one lead of capacitor 370 of 0.5 uf, whose other lead is connected to ground.

Whenever transistor 344 is in its conducting state, current flows from terminal 368 to terminal 366 of yoke 364 and through the collector-emitter path of transistor 344. It will be appreciated that the yoke may be, for example, a standard Litz wire yoke of approximately 75 uh or a Litz wire yoke of approximately 75 uh with compensation networks and a linearity coil. The latter type of yoke is identified by reference numeral 364a in FIG. 3.

As shown in FIG. 5, current flows through collector terminal 354 of transistor 344 from $T_3$ to $T_5$. When the drive signal circuit input signal 348 changes at $T_4$ from a positive voltage to a negative voltage, the base current waveform 350 begins to decrease but does not completely switch transistor 344 to the nonconducting state until $T_5$. From $T_4$ to $T_5$, the yoke current waveform 352 continues to increase as a consequence of the large amount of charge stored in the emitter-base junction of transistor 344.

When signal waveform 348 changes at $T_4$ from the positive cycle to the negative cycle and after the charge stored in transistor 344 is swept out (from $T_4$ to $T_5$), the horizontal deflection "flyback" period of the yoke of the cathode ray tube is initiated. During flyback, transistor 344 is in the nonconducting state. With transistor 344 in the nonconducting state, the very high impedance produced by inductor 358 appears at junction node 362. The energy stored in yoke 364 from $T_3$ to $T_5$ is, therefore, transferred to flyback capacitor 372 of 3500 pf and stores approximately 1200 volts from $T_5$ to $T_6$.

At $T_6$, the yoke current is zero, which represents the half-way point in the flyback period. From $T_6$ to $T_7$, the energy stored in flyback capacitor 372 is transferred back to yoke 364. The transfer of energy between flyback capacitor 372 and yoke 364 is damped by damper diode 374, which is connected to junction node 362. Damper diode 374 is a bridge rectifier circuit, such as a RKBPC606 device manufactured by General Instruments. The bridge rectifier comprises a parallel combination of two diodes connected in series. Each pair of parallel diodes is capable of withstanding approximately twelve hundred volts and three amperes of current. The damper diode is, therefore, capable of sourcing 6 amperes of current from ground. The diodes have a fast recovery time of approximately 200 nsec after the yoke current reaches zero amperes at $T_3$.

The start of a transfer of energy back to flyback capacitor 372 develops a negative voltage that forward biases the diodes in the bridge rectifier of damper diode 374. Damper diode 374 provides a discharge path to ground of the energy stored in yoke 364.

Diode 360 is included to prevent current from flowing through collector terminal 354 of transistor 344 during the time from $T_1$ to $T_3$. From $T_1$ to $T_3$, current is flowing into the base of transistor 344 and current is flowing from terminal 366 to terminal 368 of yoke 364. Diode 360 prevents the flow of current from the collector of transistor 344 to the yoke and thereby promotes the build up of charge in the emitter-base junction of transistor 344 during this time. It is desirable to promote a large amount of current flowing into the base of transistor 344 to ensure that it is biased into the conducting state at $T_3$ when it is desired to have the yoke current flowing through it. This consideration is essential for promoting the overall efficiency of the power amplifier and maintaining relatively fast transition times between the switching states of the device.

Resistors 376 and 378 are connected in series between the +150 volt DC supply and lead 368 of yoke 364. Each one of resistors 376 and 378 is 20 ohms and rated at 10 watts. Inductor 358, capacitor 370, and series resistors 376 and 378 form a parallel resonant circuit. Capacitor 370 serves to "round off" the yoke current waveform near its maximum values as shown on waveform 352 of FIG. 5. Capacitor 370 is included in horizontal deflection circuits to make more uniform the deflection speed of the electron beam as it traverses the screen of the cathode ray tube. Resistors 376 and 378, therefore, provide a means for damping the resonant circuit of inductor 358 and capacitor 370 when a high efficiency yoke and a high efficiency switch, such as the 2SD348 specified for transistor 344, are used. An example of an efficient yoke is a Model No. C7635-2 manufactured by Syntronic Instruments, Inc. with the horizontal windings replaced with 135 strands of 38 gauge enamel-coated wire. Each of the two coils has 16 turns.

Traditionally, the resistive losses of the yoke and switch were used to damp the circuit. In the high efficiency circuit described in the exemplary preferred embodiment, resistors 376 and 378 provide the necessary damping without diminishing the efficiency of the circuit.

Power Level Fault Detector Circuit

Figure 7:
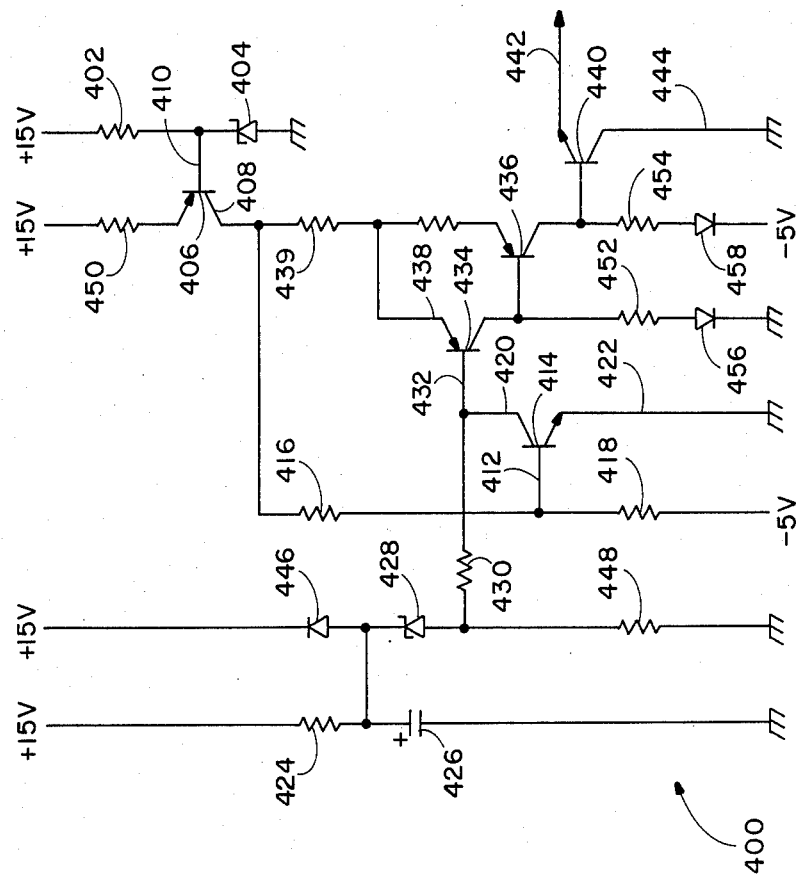
FIG. 7 is an electrical circuit diagram of a power level fault protection circuit which ceases operation of the drive amplifier upon the detection of a power supply regulator failure.

FIG. 7 is a circuit diagram of power level fault detector circuit 400. In normal operation, the +15 volt and −5 volt DC supplies cause fault detector circuit 400 to provide a ground connection for reference point 260 (FIG. 2). The +15 volts applied to resistor 402 cooperates with the 6.2 volt zener 404 to saturate PNP transistor 406, which is a MPS6523 or equivalent device. The voltage at collector terminal 408 of transistor 406 is thereby fixed at 6.75 volts by the combination of the 6.2 volts present on base terminal 410 of transistor 406 and the voltage drop across its emitter and collector. Base terminal 412 of NPN transistor 414 is biased by this 6.75 volt reference signal through resistor 416 of 91 kilohms and by the −5 volt power signal through bias resistor 418 of 68 kilohms. Transistor 414 is a 2N3565 or equivalent device. Whenever the +15 and −5 volt supplies are operating within prescribed limits described below, transistor 414 will be biased into cutoff, thereby allowing no current to flow from its collector terminal 420 to its emitter terminal 422, which is grounded. Under these conditions, transistor 414 is effectively removed from the circuit.

The +15 volt power supply being monitored for nominal operation is connected through resistor 424 of 2 kilohms to capacitor 426 of 22 uf and 8.2 volt zener diode 428. Resistor 424 and capacitor 426 filter transients present on the +15 volt power line resulting from the high currents being switched in the inductive circuits of the power amplifier. Whenever transistor 414 is biased into cutoff, as is the case when the −5 volt and +15 volts DC supplies are operating properly, the voltage appearing at both leads of resistor 430 of 10 kilohms is 6.8 volts, which is the difference between the voltage of the +15 volt power supply and the 8.2 volt drop across the zener diode 428. This voltage is applied to base terminal 432 of PNP transistor 434.

Transistors 434 and 436 form a Schmidt trigger. Both transistors are are MPS6523 or equivalent devices. Emitter terminal 438 of transistor 434 is connected through resistor 439 of 1.5 kilohms to the 6.75 volt reference signal at collector terminal 408 of transistor 406. Transistor 434 is turned on whenever the voltage at its base terminal 432 is less than approximately +3.8 volts, which represents the voltage present on emitter terminal 438 of transistor 434 plus 0.6 volts. Under nominal operating conditions, the voltage at base terminal 432 of transistor 434 exceeds 3.8 volts (nominally 6.8 volts), which keeps transistor 434 in the cutoff state. Whenever transistor 434 is in the cutoff state, transistor 436 is turned on. Turning on transistor 436 also turns on NPN transistor 440 and thereby electrically connects its emitter terminal 442 to its collector terminal 444, which is grounded. Transistor 440 is a MPS6521 or equivalent device. Emitter terminal 442 of transistor 440 is connected to reference point 260 (FIG. 2) and thereby grounds leads 256 and 258 of coils 252 and 254, respectively, under nominal operating conditions.

Whenever the −5 volt supply increases above −4 volts, transistor 414 turns on, thereby allowing the voltage at its collector terminal 420 to drop to near zero volts. This pulls base terminal 432 of transistor 434 to ground and causes it to turn on. When transistor 434 turns on, transistor 436 turns off. Turning off transistor 436 also turns off transistor 440 and thereby removes emitter terminal 442 of transistor 440 and reference point 260 (FIG. 2) from ground.

Whenever the voltage present on the +15 volt supply drops below +12 volts, the voltage on base terminal 432, as seen through zener diode 428, of transistor 434 drops below 3.8 volts. This causes transistor 434 to turn on, which again causes transistors 436 and 440 to turn off, thereby removing emitter terminal 442 of transistor 440 and reference point 260 (FIG. 2) from ground.

Removing reference point 260 from ground when the −5 volt power supply increases above −4 volts and the +15 volt power decreases below +12 volts prevents continued operation of the drive amplifier. This is done because the efficiency of the drive amplifier diminishes under these conditions and severely impairs its performance.

Changing the Power Amplifier Operating Frequency

The component values specified above correspond to a power amplifier operating frequency of about 125 kHz. With a few component substitutions, the power amplifier of the present invention can be modified to operate at frequencies of about 270 kHz. The power amplifier can operate at frequencies in excess of 270 kHz if attention is directed to details such as the heat dissipation and frequency limits of the power transistor, leakage inductance of the impedance transformers, flux density and heat limits (thermal design) of the yoke, and the stiffness of the electron beam being deflected.

The frequency sensitive components are indicated in the table below.

Figure 6:
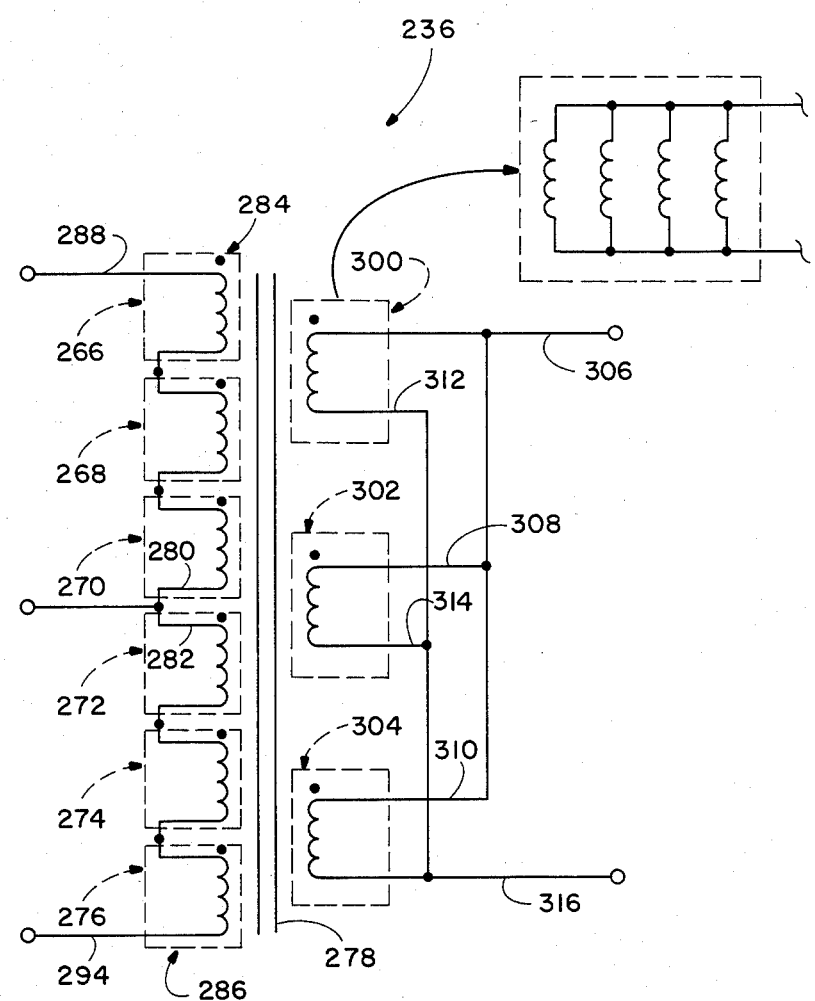
FIG. 6 is a schematic diagram of an alternative output impedance transformer for a drive amplifier designed to operate at 270 kHz in accordance with the present invention.

|  | 64–180 kHz | 225–270 kHz |
|---|---|---|
| Impedance transformer 202 | See FIGS. 4A and 4B | See FIG. 6 |
| Resistor 336 | 0.5 ohms, 5 watt | 5 ohms, 5 watt |
| Transistors 292 and 298 | MJE521 | MJE224 |
| Drive signal circuit supply voltage | +15 volts | +18 volts |
| Capacitor 370 | 0.5 uf | 0.2 uf |

-continued

| | 64–180 kHz | 225–270 kHz |
|---|---|---|
| Damping resistors 376 and 378 | 20 ohms, 10 watt | 50 ohms, 10 watt |

The impedance transformer 202 for 225–270 kHz operation has an input transformer 234 and an output transformer 236. Input transformer 234 is the same as that depicted in FIG. 4A. Output transformer 236 differs from that depicted in FIG. 4B only in the following respects. Each one of the six primary coils of output transformer 236 comprises four strands of 26 gauge enamel-coated wire that is wound around core 278 as three turns. Each one of the three secondary coils of output transformer 236 comprises four strands of 26 gauge enamel-coated wire that is wound around core 278 as three turns.

Timing capacitor 36 is an oscillator frequency-determining component. For 125 kHz and 270 kHz operation, capacitor 36 is 0.001 uf and 470 pf, respectively.

If operation below 100 kHz is contemplated, the +150 volts applied to the yoke should be reduced so that its stored energy will not destroy power transistor 344.

It will be obvious to those having skill in the art that many changes may be made in the above-described details of the preferred embodiment of the present invention. The scope of the present invention, therefore, should be determined only by the following claims.

What is claimed is:

1. In a power amplifier for driving a deflection coil, the amplifier including a solid-state switching device that provides an output electrical signal which drives the deflection coil in response to an applied drive signal, a method of promoting efficient use of electrical power to drive the deflection coil, comprising:
    applying a continuous-wave signal to drive the switching device, the continuous-wave signal having a time interval during which a predetermined polarity causes a current to flow in a direction to drive the switching device to a conducting state; and
    preventing current flow through the switching device in a direction opposite to that of the drive current during the time interval, thereby to provide a generally increasing amount of electrical current during substantially the entire time the continuous-wave signal is in the predetermined polarity.

2. The method of claim 1 in which the solid-state switching device comprises a bipolar transistor and in which the continuous-wave signal is applied to the base terminal of the transistor and the prevention of current flow through the switching device in the opposite direction is accomplished by electrically connecting a diode to the collector terminal of the transistor to prevent electrical current flow that results from a forward bias voltage across the collector-base junction of the transistor.

3. A power amplifier designed in accordance with the method of claim 1.

4. A high-speed power amplifier for driving a deflection coil, comprising:
    an oscillator developing a continuous-wave output signal having a portion with a predetermined polarity;
    switching means comprising a solid state switching device for providing a deflection signal to the deflection coil, the switching means including drive signal preserving means to provide a drive signal of a generally increasing amount of electrical current during the time the continuous-wave signal is in the predetermined polarity; and
    impedance matching means for matching the output impedance of the oscillator to the input impedance of the switching means, the impedance matching means including a filar-wound power transformer whose response time characteristics do not change substantially the transition time characteristics of the continuous-wave signal, thereby to provide an amplifier that is operable at relatively high switching speeds and at relatively low power.

5. The power amplifier of claim 4 in which the continuous-wave output signal is in the form of a square-wave and the oscillator includes means for maintaining substantially a 50% duty cycle of the square-wave signal.

6. The power amplifier of claim 4 in which the oscillator includes first means for receiving an applied synchronizing signal to synchronize the continuous-wave output signal to the synchronizing signal and second means for developing a continuous-wave output signal at a predetermined frequency in the absence of the synchronizing signal.

7. The power amplifier of claim 4 in which the solid-state switching device comprises a power transistor whose base terminal receives the drive signal shaped by a coupling circuit and whose collector terminal is electrically connected to the deflection coil and in which the drive signal preserving means comprises a diode positioned in series connection with the collector terminal to prevent the flow of electrical current between the collector terminal and the base terminal and thereby promote the increase in the amount of electrical current of the drive signal.

8. The power amplifier of claim 4 in which the oscillator comprises:
    first means for developing a bipolar continuous-wave output signal, second means responsive to the continuous-wave output signal for producing a correction signal corresponding to the duty cycle of the continuous-wave output signal, and third means responsive to the correction signal to cause the continuous-wave output signal to have substantially a 50% duty cycle,
    the first means including a monostable multivibrator and the third means including a timing component of the monostable multivibrator that establishes the frequency of the continuous-wave output signal, and
    the second means including a variable current source that is capable of delivering an amount of current to the timing component to develop the continuous-wave output signal of 50%.

* * * * *